United States Patent
Shin

(10) Patent No.: US 7,371,639 B2
(45) Date of Patent: May 13, 2008

(54) NONVOLATILE MEMORY DEVICE AND METHOD FOR FABRICATING THE SAME

(75) Inventor: Eun Jong Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 64 days.

(21) Appl. No.: 11/206,257

(22) Filed: Aug. 15, 2005

(65) Prior Publication Data

US 2006/0033150 A1   Feb. 16, 2006

(30) Foreign Application Priority Data

Aug. 13, 2004 (KR) .................. 10-2001-0063869

(51) Int. Cl.
*H01L 21/336* (2006.01)
(52) U.S. Cl. .............. 438/257; 438/201; 438/259
(58) Field of Classification Search ............ 438/201, 438/257–267
See application file for complete search history.

(56) References Cited

U.S. PATENT DOCUMENTS

| | | |
|---|---|---|
| 4,764,480 A | 8/1988 | Vora |
| 4,929,988 A | 5/1990 | Yoshikawa |
| 5,801,415 A | 9/1998 | Lee et al. |
| 6,084,265 A | 7/2000 | Wu |
| 6,225,162 B1 | 5/2001 | Lin et al. |
| 6,583,466 B2 | 6/2003 | Lin et al. |
| 6,587,396 B1 * | 7/2003 | Jang ............... 438/259 |
| 6,720,218 B2 * | 4/2004 | Jang ............... 438/257 |
| 6,734,055 B1 * | 5/2004 | Lin et al. ........... 438/201 |
| 7,037,785 B2 | 5/2006 | Dong et al. |
| 2001/0000112 A1 | 4/2001 | Lin et al. |
| 2004/0029345 A1 | 2/2004 | Deleonibus et al. |
| 2005/0116279 A1 | 6/2005 | Koh |

FOREIGN PATENT DOCUMENTS

| | | |
|---|---|---|
| KR | 1992-0002091 | 3/1992 |
| KR | 2002-0017425 | 3/2002 |

OTHER PUBLICATIONS

Eun Jeong Park; Flash EEPROM Cell and Fabricating Method Thereof; Korean Patent Abstracts; Publication No. 1020020017425 A; Mar. 7, 2002; Korean Intellectual Property Office, Republic of Korea.

Kunlyosi Yoshikawa; Nonvolatile Semiconductor and Manufacturing There; European Patent Abstract of EP0304896, corresponding to Korean Patent No. KR9202091; Mar. 10, 1992; esp@cenet.com database—Worldwide (http://v3,espacenet.com/).

* cited by examiner

*Primary Examiner*—Kevin M Picardat
(74) *Attorney, Agent, or Firm*—Andrew D. Forntey

(57) ABSTRACT

A nonvolatile memory device and a method for fabricating the same decreases power consumption and prevents contamination of an insulating layer. The nonvolatile memory devices includes a semiconductor substrate; a tunneling oxide layer formed on a predetermined portion of the semiconductor substrate; a floating gate formed on the tunneling oxide layer, the floating gate having a trench structure; a control gate formed inside the trench structure of the floating gate; and a gate insulating layer disposed between the floating gate and the control gate.

20 Claims, 5 Drawing Sheets

NONVOLATILE MEMORY DEVICE AND METHOD FOR FABRICATING THE SAME

CROSS-REFERENCE TO RELATED APPLICATIONS

This application claims the benefit of Korean Application No. P2004-63869 filed on Aug. 13, 2004, which is hereby incorporated by reference as if fully set forth herein.

BACKGROUND OF THE INVENTION

1. Field of the Invention

The present invention relates to a nonvolatile memory device, and more particularly, to a method for fabricating a nonvolatile memory device, which decreases power consumption and prevents contamination of an insulating layer.

2. Discussion of the Related Art

Nonvolatile memory devices are advantageous in that there is no loss of data even with power supply interruption, which has led to their widespread use for data storage of computer BIOS chips, set-top boxes, printers, network servers, digital cameras, and mobile phones. Among nonvolatile memory devices, an electrically erasable programmable read-only memory (EEPROM) device enables data erase operations from individual memory cells or by sectors. A cell transistor of an EEPROM device is programmed by increasing the transistor's threshold voltage by generating channel hot electrons on the drain side, which are then stored in a floating gate, and is erased by lowering the threshold voltage by generating a high voltage potential between the floating gate and the source/substrate to thereby discharge the stored channel hot electrons.

Meanwhile, flash memory is a specific form of nonvolatile memory by which data bits are stored in units of memory or memory cells. A grouping of memory cells can be termed a word, a grouping of words can be termed a page, and a grouping of pages can be termed a sector. Data can be accessed for reading and programming by word or page, while an entire sector is commonly accessed for erasing, as in a "flash."

FIGS. 1A and 1B illustrate a process for fabricating a flash memory device according to the related art, which has a stacked gate structure comprising a floating gate and a control gate. The floating gate stores electrical charges for the gate, and the control gate receives a drive voltage.

Referring to FIG. 1A, a tunneling oxide layer 11a is formed on a predetermined portion of a semiconductor substrate 11, and a stacked gate 12 is formed on the tunneling oxide layer by a series of deposition steps to form layers of a stacked gate structure. The stacked gate 12 comprises a polysilicon layer for the formation of a floating gate 12a, a gate insulating layer 12b having an oxide-nitride-oxide structure, and a polysilicon layer for the formation of a control gate 12c, which are sequentially formed on the tunneling oxide layer 11a. The polysilicon layer for floating gate formation has a thickness of 800~1200 Å formed by low-pressure chemical mechanical deposition, and the polysilicon layer for control gate formation has a thickness of 2000~2200 Å, also formed by low-pressure chemical mechanical deposition.

Subsequently, a photolithography process is used to form the stacked gate 12 structure, comprised of the control gate 12c, the gate insulating layer 12b, and the floating gate 12a, by etching the structure obtained through previous deposition steps. That is, the photolithography process is used to remove selectively (i.e., etch) portions of the polysilicon layer for control gate formation, the gate insulating layer 12b, and the polysilicon layer for floating gate formation, thereby forming the stacked gate 12. Linear layers (oxide sidewalls) 13 are then formed on internal sides of the stacked structure, that is, on each of the control gate 12c, the gate insulating layer 12b, and the floating gate 12a.

Referring to FIG. 1B, insulating sidewalls 14 are formed outwardly beside the liner layers 13. Then, impurity ions are implanted using the stacked gate 12 and the insulating sidewalls 14 as a mask, thereby forming source/drain regions 15 and 16. Subsequently, a silicide layer 17 is formed on exposed surfaces of the source/drain regions 15 and 16 and the control gate 12c. An insulating interlayer 19 is formed on the entire surface of the resulting structure, and a plurality of contact holes is formed in the insulating layer to expose the silicide layer 17 above the source/drain regions 15 and 16 and the control gate 12c. A plurality of plugs 18 is formed by filling the contact holes.

In the above process for fabricating a flash memory device according to the related art, the etching of the photolithography process to form the stacked gate structure includes two steps, namely, wet-etching and dry-etching, which is a complex procedure. This two-step process is performed to minimize plasma damage during photolithography. The gate insulating layer may nevertheless become contaminated as a result of plasma damage or due to the multi-step etching conditions themselves.

To program the above flash memory device according to the related art, a programming voltage is applied to the control gate 12c through a word line and to the drain 16 through a bit line. Thus, electrons of the drain 16 are injected toward the floating gate 12a through the tunneling oxide layer 11a by way of a hot-carrier method. In erasing data, an erasing voltage is applied to the source 15 through a source line. Thus, electrons injected to the floating gate 12a are discharged to the channel through the tunneling oxide layer 11a.

The above operation is achieved in accordance with a coupling among elements of the stacked gate, specifically, between interfaces of the control gate and the floating gate and between interfaces of the floating gate and the drain, and the coupling ratio should be maximized to decrease power consumption. Therefore, an improvement of the coupling ratio is needed to decrease power consumption of the device, so that low-power flash memory devices can be provided for mobile products requiring low power consumption.

SUMMARY OF THE INVENTION

Accordingly, the present invention is directed to a nonvolatile memory device and a method for fabricating the same that substantially obviates one or more problems due to limitations and disadvantages of the related art.

An object of the present invention is to provide a nonvolatile memory device to decrease power consumption, and a method for fabricating the same.

Another object of the present invention is to provide a nonvolatile memory device to prevent an insulating layer from becoming contaminated by plasma damage, and a method for fabricating the same.

Another object of the present invention is to provide a method for fabricating a nonvolatile memory device, which enables a simplified photolithography process for the formation of a stacked gate, and a nonvolatile memory device suitable for the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a nonvolatile memory device, comprising a semiconductor substrate; a tunneling oxide layer formed on a predetermined portion of the semiconductor substrate; a floating gate formed on the tunneling oxide layer, the floating gate having a trench structure; a control gate formed inside the trench structure of the floating gate; and a gate insulating layer disposed between the floating gate and the control gate.

In another aspect, there is provided a method for fabricating a nonvolatile memory device, comprising forming a tunneling oxide layer on a predetermined portion of a semiconductor substrate; forming a first polysilicon layer for a formation of a floating gate on the tunneling oxide layer; forming a trench in the first polysilicon layer for floating gate formation, the trench having a predetermined depth; forming a gate insulating layer in the trench formed in the first polysilicon layer for floating gate formation; forming, on the gate insulating layer, a second polysilicon layer for a formation of a control gate; performing chemical mechanical polishing with respect to the second polysilicon layer for control gate formation; forming, over the floating gate, the gate insulating layer, and the control gate, a photoresist pattern for forming the floating gate; and etching the first polysilicon layer for floating gate formation a using the photoresist pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference numbers will be used throughout the drawings to refer to the same or similar parts.

FIGS. 2A-2E illustrate a process for fabricating a nonvolatile memory device according to the present invention. As an initial step in the process, a sacrificial oxide film (not shown) is formed on the semiconductor substrate and is removed, by wet-etching, after the formation of a well and a channel layer by respective ion-implantation processes.

Figure 1A:
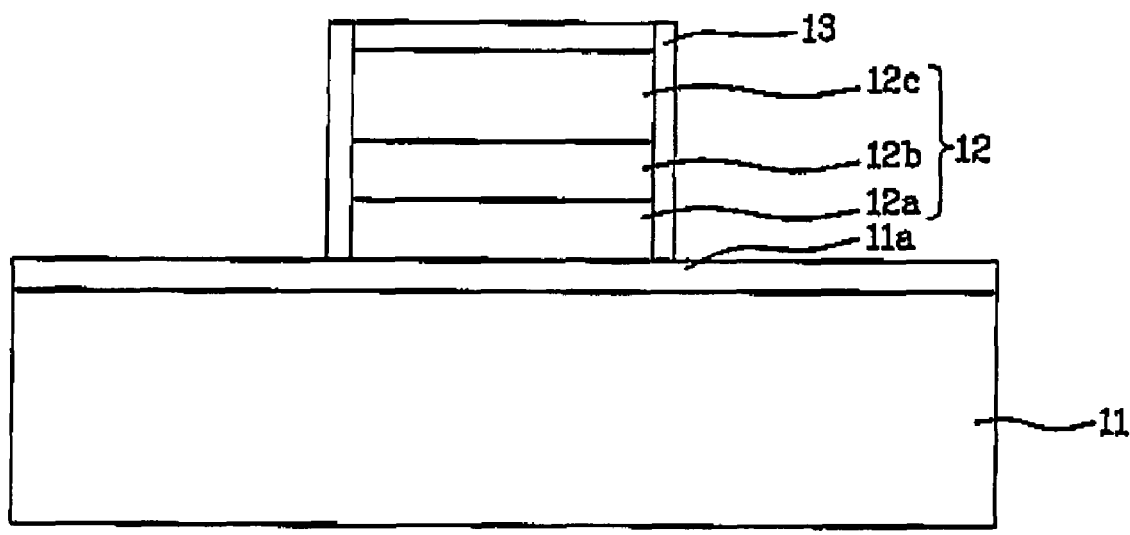
FIGS. 1A and 1B are cross-sectional views illustrating a process for fabricating a nonvolatile memory device according to the related art.
Figure 1B:
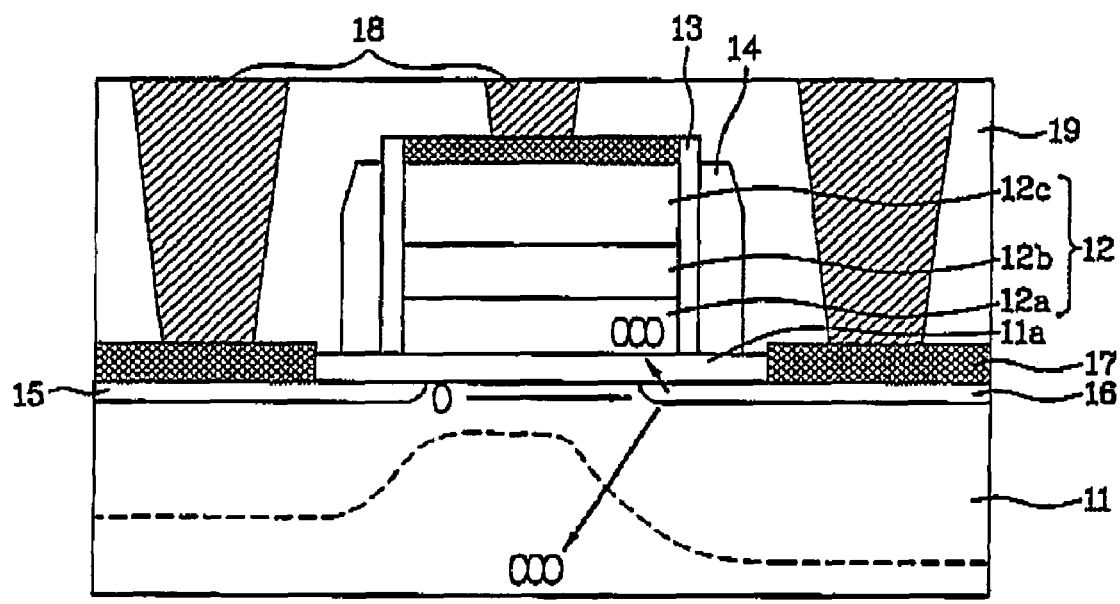
Figure 2A:
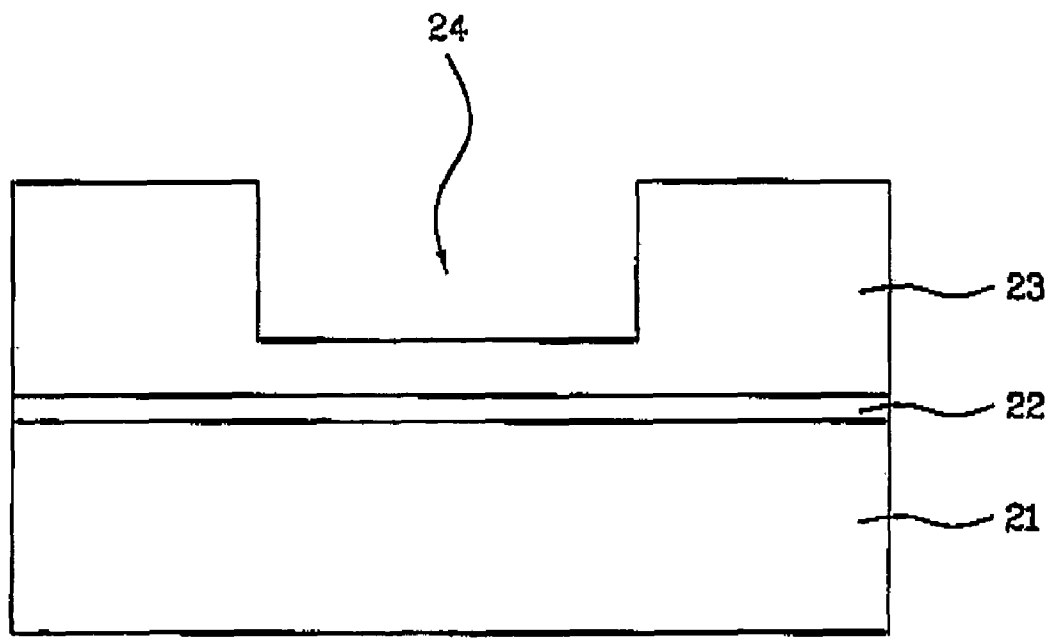
FIGS. 2A-2E are cross-sectional views illustrating a process for fabricating a nonvolatile memory device according to the present invention.

Referring to FIG. 2A, a tunneling oxide layer 22 is formed on a semiconductor substrate 21 to a thickness of 90~100 Å, using a furnace thermal process performed at a temperature of 700~800° C. Low-pressure chemical vapor deposition is then carried out to form a first polysilicon layer 23 having a thickness of 4500~5500 Å on the tunneling oxide layer 22. The first polysilicon layer 23 thus formed will later serve, after etching, as the floating gate of the nonvolatile memory device. A trench 24 is formed in the first polysilicon layer 23 for floating gate formation by removing, using a chloride gas ($Cl_2$) etching process, a predetermined interior portion of the first polysilicon layer, which will later serve as an encasement for the control gate of the nonvolatile memory device. After etching, the trench 24 preferably has a depth of 2500~3500 Å, such that, assuming an initial formation thickness of 4500~5500 Å for the first polysilicon layer 23, about 1000~3000 Å of its thickness remains to form the lower side of the trench.

Figure 2B:
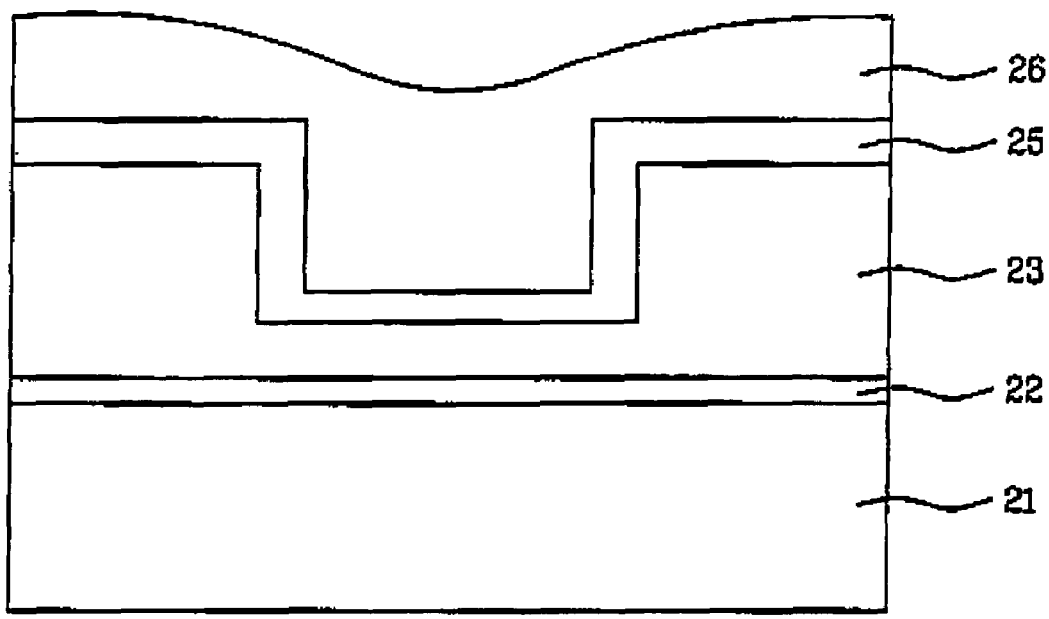

Referring to FIG. 2B, a gate insulating layer 25 is formed on the surface of the first polysilicon layer 23 so as to cover the inner walls of the trench 24 with an oxide-nitride-oxide structure including a sequential formation of an oxide layer, a nitride layer, and another (i.e., upper) oxide layer by, for example, a known method. The lower oxide layer of the gate insulating layer 25 is formed to a thickness of 50~70 Å by low-pressure chemical vapor deposition at a temperature of about 700~800° C.; the nitride layer of the gate insulating layer is formed to a thickness of 60~80 Å, also by low-pressure chemical vapor deposition but at a temperature of about 650~750° C.; and the other oxide layer is formed by a furnace thermal process at a temperature of about 800~900° C. Low-pressure chemical vapor deposition is performed to deposit a second polysilicon layer 26, for control gate formation, on the entire surface of the resulting structure. The second polysilicon layer 26 may have a thickness of 3500~4500 Å, which is substantially thicker than the depth of the trench 24.

Figure 2C:
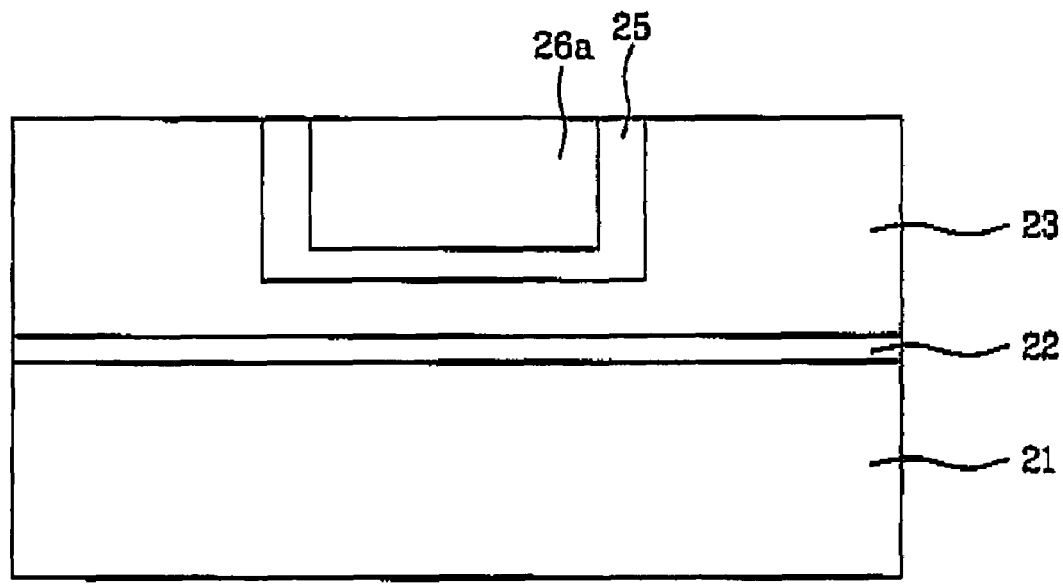

Referring to FIG. 2C, the thickly formed second polysilicon layer 26 is planarized by chemical mechanical polishing to form a control gate 26a flush with the surface of the first polysilicon layer 23 and separated from the first polysilicon layer by the gate insulating layer 25. Thus, the respective materials of the second polysilicon layer 26 and the gate insulating layer 25 remain in the trench 24, and the control gate 26a is disposed so as to be encased in the first polysilicon layer 23 interposing the gate insulating layer 25. In doing so, the opposing surface area of the interface between the control gate 26a and the material of the first polysilicon layer 23 for floating gate formation is increased, thereby increasing a coupling ratio and decreasing power consumption of the device accordingly.

Figure 2D:
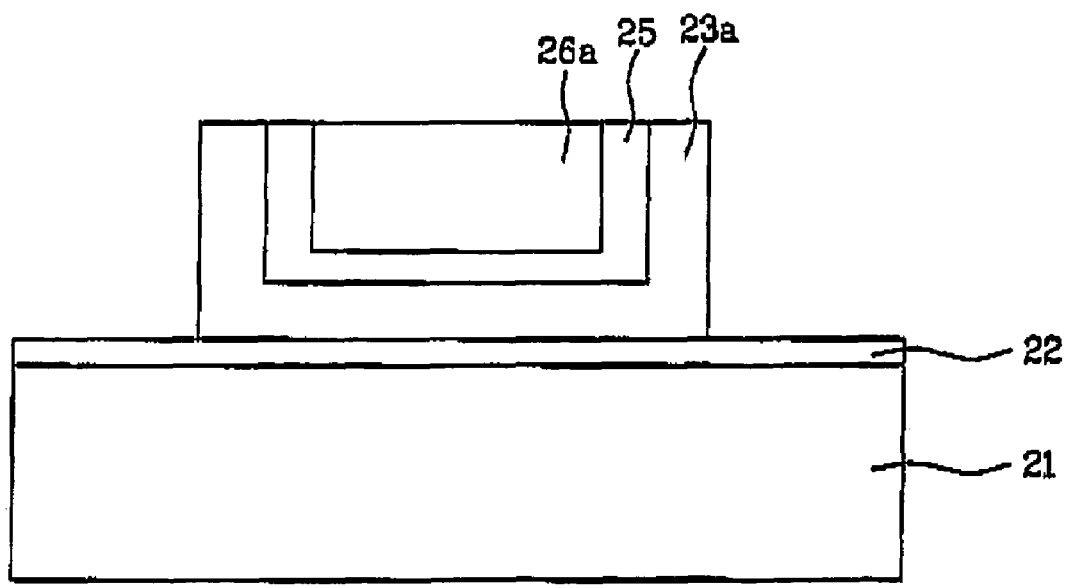

Referring to FIG. 2D, a photoresist (not shown) is formed on the entire surface of the resulting structure of FIG. 2C, including the exposed upper surfaces of the control gate 26a, the gate insulating layer 25, and the first polysilicon layer 23. An exposure and development process (i.e., photolithography) is then carried out to form a mask pattern used in etching the first polysilicon layer 23 to form a floating gate 23a, which is thus imparted with a trench structure whose interior is filled with the gate insulating layer 25 and the control gate 26a. Thus, a photoresist pattern for forming the floating gate 23a is positioned over the floating gate, the gate insulating layer 25, and the control gate 26a, and the first polysilicon layer 23 for floating gate formation is isotropically etched using the photoresist pattern. Therefore, in contrast with the process of the related art, the gate of the nonvolatile memory device is formed by an etching of a polysilicon layer for floating gate formation, through application of a single-step etching process, thereby preventing the possibility of any contamination of the gate insulating layer, which may result from plasma damage during the etching process used in the device fabrication according to the related art.

Figure 2E:
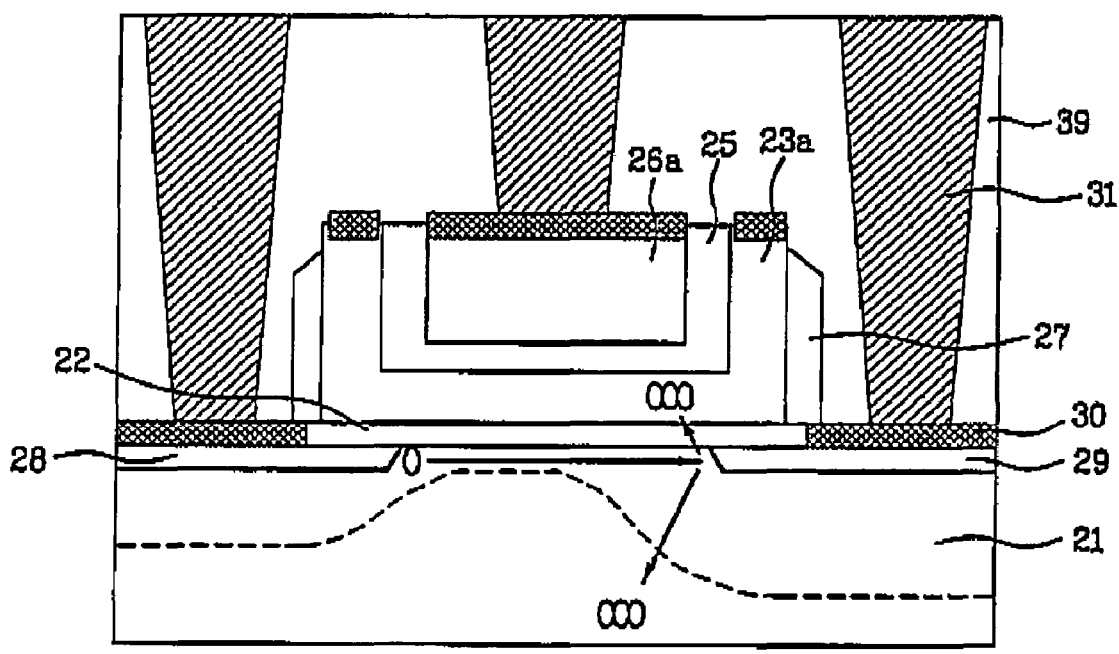

Referring to FIG. 2E, an insulating layer (not shown) is deposited and then etched back to form insulating sidewalls 27 on the lateral sides of the floating gate 23a, and impurity ions are implanted using the floating gate and insulating sidewalls as a mask, thereby forming source/drain regions 28 and 29 in the semiconductor substrate 21 on either side of the floating gate. Subsequently, a silicide process is performed with respect to the substrate, thereby imparting a silicide layer 30 to upper surfaces of the floating gate 23a and the control gate 26a and to the semiconductor substrate 21 in correspondence with the source/drain regions 28 and 29. An insulating interlayer 39 is formed on the entire surface of the resulting structure, and a plurality of contact holes is formed in the insulating layer to expose the silicide layer 30 above the source and drain 28 and 29 and the control gate 26a. A plurality of conductive plugs 31 is formed by filling the contact holes.

Accordingly, a nonvolatile memory device according to the present invention is shown in FIG. 2E. The nonvolatile memory device according to the present invention comprises the semiconductor substrate 21; the tunneling oxide layer 22 formed in a predetermined portion of the upper surface of the semiconductor substrate; the floating gate 23a formed as a trench structure having an interior, the trench structure being formed on the tunneling oxide layer; the control gate 26a formed inside the interior of the trench structure of the floating gate; and the gate insulating layer 25, having an oxide-nitride-oxide structure, disposed between the floating gate and the control gate. Thus, the gate insulating layer 25 and the control gate 26a are both disposed inside the trench, to be substantially encased by the floating gate 23a itself, i.e., the trench structure. The insulating sidewalls 27 are formed on the lateral sides of the floating gate 23a, i.e., outside the trench, and the source/drain regions 28 and 29 are formed in the semiconductor substrate 21 in correspondence with the outer sides of the floating gate. The silicide layer 30 is formed on the upper (exposed) surfaces of the control gate 26a and the floating gate 23a, to be disposed on the top surfaces of the trench structure of the floating gate, and is also disposed over each of the source/drain regions 28 and 29, that is, in the surface of the semiconductor substrate 21 corresponding to the source/drain regions. The insulating interlayer 39 is formed on the entire resulting surface of the semiconductor substrate 21. The plurality of conductive plugs 31 are connected, through the insulating interlayer 39, to each of the control gate 26a and the source/drain regions 28 and 29, to provide electrical contact with external circuitry, such as a word line, bit line, or source line (not shown).

As described above, by adopting the nonvolatile memory device and method for fabricating the same according to the present invention, it is possible to increase the size of the interface, i.e., opposing surface area, between the control gate 26a and the floating gate 23a, thereby decreasing power consumption owing to the increasing coupling ratio. Also, the first polysilicon layer 23 for floating gate formation is etched through a single-step etching process to form the gate of the device, thereby enabling a prevention of a contamination of the gate insulating layer 25 due to plasma damage during an etching process for forming a conventional stacked gate for a nonvolatile memory device such as a flash memory device.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating a nonvolatile memory device, comprising:
   forming a tunneling oxide layer on a predetermined portion of a semiconductor substrate;
   forming a first polysilicon layer for formation of a floating gate on the tunneling oxide layer;
   forming a trench in the first polysilicon layer, the french having a predetermined depth;
   forming a gate insulating layer in the trench formed in the first polysilicon layer;
   forming, on the gate insulating layer, a second polysilicon layer for formation of a control gate;
   performing chemical mechanical polishing with respect to the second polysilicon layer and the gate insulating layer; and
   etching a portion of the first polysilicon layer using a photoresist pattern, wherein a remaining portion of the first polysilicon layer forms the floating gate.

2. The method of claim 1, wherein the first polysilicon layer has a thickness of 4500~5500 Å.

3. The method of claim 1, wherein forming the first polysilicon layer comprises low-pressure chemical vapor deposition.

4. The method of claim 1, wherein the trench formed in the first polysilicon layer comprises an etching process using chlorine gas ($Cl_2$).

5. The method of claim 1, wherein the trench formed in the first polysilicon layer has a depth of 2500~3500 Å.

6. The method of claim 1, wherein the second polysilicon layer has a thickness of 3500~4500 Å.

7. The method of claim 1, wherein said etching is isotropic etching.

8. The method of claim 1, further comprising:
   forming, after forming the control gate, insulating sidewalls on lateral sides of the floating gate;
   forming source/drain regions in the semiconductor substrate on either side of the floating gate; and
   forming a silicide layer on upper surfaces of the floating gate and the control gate and on the semiconductor substrate in correspondence with the source/drain regions.

9. The method of claim 3, wherein forming the first polysilicon layer comprises covering the tunneling oxide layer with the first polysilicon layer.

10. The method of claim 1, wherein forming the gate insulating layer comprises:
    forming a lower oxide layer having a thickness of about 50~70 Å by low pressure chemical vapor deposition, wherein the lower oxide layer covers all surfaces within the trench and an upper surface area of the first polysilicon layer adjacent to the trench;
    forming a nitride layer having a thickness of about 60~80 Å over the lower oxide layer by low pressure chemical vapor deposition; and
    forming an upper oxide layer over the nitride layer.

11. The method of claim 10, wherein forming the second polysilicon layer fills a remaining space in the trench.

12. The method of claim 11, wherein chemical mechanical polishing the second polysilicon layer and the gate insulating layer exposes an upper surface area of the first polysilicon layer adjacent to the trench.

13. The method of claim 12, wherein the photoresist pattern is formed over an entire top surface of the control gate, entire top surfaces of the gate insulating layer, and a portion of the upper surface area of the first polysilicon layer adjacent to the trench.

14. The method of claim 12, wherein the second polysilicon layer and the gate insulating layer are completely within the trench after chemical mechanical polishing.

15. The method of claim 8, wherein forming the source/drain regions comprises implanting impurity ions into the semiconductor substrate using the floating gate, the gate insulating layer, the control gate, and the insulating sidewalls as a mask.

16. The method of claim 8, further comprising forming an insulating layer covering the semiconductor substrate and all structures Thereon after forming the suicide layer.

17. The method of claim 16, further comprising forming contact holes in the insulating layer to expose the silicide layer over the source/drain regions and the control gate.

18. The method of claim 17, further comprising forming conductive plugs in the contact holes.

19. The method of claim 1, wherein forming the tunneling oxide layer comprises thermal oxidation of the semiconductor substrate at a temperature of about 700~800°C.

20. The method of claim 1, wherein the tunneling oxide layer has a thickness of about 90~100 Å.

* * * * *